(12) United States Patent
Pugel

(10) Patent No.: US 8,634,029 B2
(45) Date of Patent: Jan. 21, 2014

(54) TUNING DEVICE WITH DIPLEXER INPUT

(75) Inventor: Michael Anthony Pugel, Noblesville, IN (US)

(73) Assignee: Thomson Licensing, Issy les Moulineaux (FR)

( * ) Notice: Subject to any disclaimer, the term of this patent is extended or adjusted under 35 U.S.C. 154(b) by 688 days.

(21) Appl. No.: 12/312,662

(22) PCT Filed: Dec. 4, 2006

(86) PCT No.: PCT/US2006/046231
§ 371 (c)(1),
(2), (4) Date: May 20, 2009

(87) PCT Pub. No.: WO2008/069783
PCT Pub. Date: Jun. 12, 2008

(65) Prior Publication Data
US 2011/0001877 A1 Jan. 6, 2011

(51) Int. Cl.
*H04N 5/44* (2011.01)
(52) U.S. Cl.
USPC ........... 348/725; 348/706; 348/707; 348/720; 348/724; 348/731; 348/729; 348/730; 348/732; 348/733; 348/565; 348/553; 725/149; 725/150; 455/213; 455/513; 370/295; 370/297; 370/480
(58) Field of Classification Search
USPC ......... 348/565, 731, 707, 678, 720, 725, 706, 348/724, 729, 730, 732, 733, 553; 725/48, 725/149, 150; 370/419, 463, 293, 295, 480, 370/532, 297; 455/213, 513
See application file for complete search history.

(56) References Cited

U.S. PATENT DOCUMENTS

| 6,862,297 | B1 * | 3/2005 | Gardner et al. | 370/503 |
| 6,983,327 | B2 * | 1/2006 | Koperda et al. | 709/229 |
| 7,043,750 | B2 * | 5/2006 | Ina | 725/131 |
| 2001/0056576 | A1 * | 12/2001 | Park et al. | 725/48 |
| 2002/0083466 | A1 * | 6/2002 | Ina | 725/121 |
| 2002/0186077 | A1 * | 12/2002 | Jantzi et al. | 330/51 |
| 2003/0035070 | A1 * | 2/2003 | Fanous et al. | 348/707 |

(Continued)

FOREIGN PATENT DOCUMENTS

| CN | 1661912 | 8/2005 |
| EP | 0344853 | 12/1989 |

(Continued)

OTHER PUBLICATIONS

International Search Report, dated Aug. 16, 2007.

(Continued)

*Primary Examiner* — Jefferey Harold
*Assistant Examiner* — Mustafizur Rahman
(74) *Attorney, Agent, or Firm* — Robert D. Shedd; Kuniyuki Akiyama

(57) ABSTRACT

The present invention includes an apparatus for distributing a received modulated RF signal to a plurality of tuners including a diplexer device. The diplexer device includes a plurality of filter circuits adapted to direct respective portions of the received modulated RF signal to respective tuner devices. In an illustrated embodiment, the tuner devices supply tuned signals to a picture in picture display device. Also disclosed is a method of receiving a modulated ready of frequency signal and routing portions of the received signal to respective tuner devices using filter devices in a diplexer or multiplexer configuration.

13 Claims, 8 Drawing Sheets

(56) References Cited

U.S. PATENT DOCUMENTS

| | | | |
|---|---|---|---|
| 2003/0147010 A1* | 8/2003 | Joung et al. | 348/565 |
| 2005/0158013 A1* | 7/2005 | Sun et al. | 386/4 |
| 2005/0195335 A1* | 9/2005 | Gomez et al. | 348/707 |
| 2005/0253663 A1* | 11/2005 | Gomez et al. | 333/100 |
| 2007/0096846 A1* | 5/2007 | Mallegol | 333/132 |
| 2009/0141183 A1* | 6/2009 | Ecoff et al. | 348/731 |

FOREIGN PATENT DOCUMENTS

| | | |
|---|---|---|
| EP | 0603535 A | 6/1994 |
| EP | 1569333 | 8/2005 |
| GB | 2059703 | 4/1981 |
| JP | 10/233972 | 9/1998 |
| JP | 10233972 | 9/1998 |
| JP | 2008/527808 | 7/2008 |
| KR | 20010056857 | 7/2001 |
| KR | 20020066632 | 8/2002 |
| NL | 8005008 | 3/1981 |
| WO | WO 2006/074291 | 7/2006 |

OTHER PUBLICATIONS

PCT Search Report Mailed Aug. 16, 2007.

* cited by examiner

TUNING DEVICE WITH DIPLEXER INPUT

This application is a National Stage Application and claims the benefit, under 35 U.S.C. §365 of International Application PCT/US2006/046231 filed Dec. 4, 2006 which was published in accordance with PCT Article 21(2) on Jun. 12, 2008 in English.

FIELD OF THE INVENTION

The present invention relates to a video receiving method and apparatus and, more particularly, to a method and apparatus for signal routing in a video receiving apparatus.

BACKGROUND

Radio-frequency (RF) communication has become ubiquitous in recent years, and the many sources of RF signals have created a congested signal environment in many areas of the United States and abroad. Simultaneously, the advent of digital communications technologies has imposed stringent requirements on characteristics of the received signal, such as noise, sensitivity, and dynamic range. Analog signals tend to degrade more gracefully than digital signals which can fall off abruptly. Therefore, digital television is one digital communications technology likely to require specific signal characteristics at the receiver.

As digital television increases in popularity, users are likely to demand improvements in performance and convenience to accompany the significant investment required to switch from analog to digital television equipment. For example, users are likely to expect reception of television signals virtually free from interference in addition to convenient integration of additional components such as set top box (STB) devices, personal video recorders (PVR), high-definition (HD) receivers, etc.

It is well-known to communicate multiple information signals concurrently by frequency division multiplexing. For example, a coaxial cable is conventionally used to carry hundreds of television channels simultaneously. Also, a single terrestrial antenna can receive a plurality of signals at one time. The plurality of signals can originate from a common source, or from multiple geographically separated sources.

Consumer demand has led to broadening functionality, and increasing sophistication, of television receiving devices. For example, receiving devices are now available that can record an incoming television channel while simultaneously displaying a second incoming television channel, both of the television channels being extracted from a common received RF signal.

It is also known to receive and record multiple television channels simultaneously, and to display multiple television channels simultaneously. For example, some consumer televisions now include multi-image display capability, such as picture in picture (PIP) functionality, picture outside picture (POP), side by side picture display, or an array of a small pictures. For example, PIP functionality allows a display of a first video signal on a first region of a video display screen while simultaneously displaying a second video signal on a second smaller region inside of, or within, the first region of the screen.

Of the purpose of explaining the present invention, the following description will be in regard to an exemplary PIP multiple image display system involving a PIP image. The described system is applicable to other types of multi-image systems. In implementing these convenient functions, it is known to use multiple tuner devices within a single receiving system. For example, a first tuner device can be used to extract a main signal from an RF carrier signal. An output video signal of the first tuner device is, for example, used to create a first video signal main image representing a portion or region of a display system on a video display screen of a PIP system. A second tuner device is used to extract a second or auxiliary image signal from the RF carrier signal. An output video signal of the second tuner device is used to create a second video signal representing an auxiliary image portion or region of a displayed image. For example, in a PIP system, the first or main video signal would be used to produce the main image region of a PIP display and the second video signal would be used to produce a small auxiliary image inset into the main picture, i.e. the PIP image.

In order to implement a multi-channel functionality such as, for example, PIP video display functionality and/or simultaneous multi-channel recording, with multiple tuners, each tuner must receive a portion of the incoming carrier signal. In a conventional tuner system, the division of the incoming signal into respective portions for each tuner is generally achieved with a signal splitter.

A signal splitter is a device that receives a signal at an input port, and produces an output signal at two or more output ports. The output signal produced at each of the two or more outputs has substantially the same frequency content as the input signal received at the input of the signal splitter. Dividing the input signal between two outputs of a passive signal splitter device results in a corresponding division of signal power. Thus, for a passive signal splitter device, the aggregate output power of the output signals is no more than the power of the input signal. Each output signal contains only a portion, or share, of the power of the original input signal.

It is known, for example, to amplify the input signal prior to signal splitting. It is also known to amplify one or more of the respective output signals of a signal splitter. Such amplification may, however, introduce undesirable distortion into the amplified signals. In addition, amplification requires the use of additional components and the provision of amplification power. This generally adds complexity and cost to a system. It is thus desirable to have a way of allocating input signal power among various tuners in a way that optimizes the signal power received at each tuner.

SUMMARY OF THE INVENTION

According to the present invention an incoming RF signal is divided according to frequency so that signals in a first frequency band are received by a first tuner and signals in a second frequency band are received by a second tuner. In one aspect of the invention, each tuner receives most of the power in its respective frequency band. This contrasts with the situation where a conventional splitter is employed. With a conventional splitter, each tuner receives power across all frequencies, with no preferential allocation of power in the range of frequencies being tuned by that tuner.

In one aspect, the invention includes a tuner system having a plurality of tuners and a frequency demultiplexer. The frequency demultiplexer distributes a received modulated carrier signal to the plurality of tuners. The frequency demultiplexer receives an input signal and produces two or more output signals. Unlike the output signals of a splitter device, the output signals of the frequency demultiplexer have frequency content that is substantially different from one another. Thus, for example, a first output signal of a frequency demultiplexer includes a respective lower band of carrier frequencies and a second output signal of the frequency demultiplexer includes a respective higher band of carrier frequencies.

In one embodiment, the lower and higher bands of frequencies are substantially orthogonal; that is the carrier frequencies found in the lower frequency band are substantially absent from the upper frequency band and the carrier frequencies found in the upper frequency band are substantially absent from the lower frequency band.

In one embodiment, the use of a frequency demultiplexer to distribute the modulated carrier signal obviates the need for a signal splitter device while achieving a more efficient distribution of signal power than would be achieved by a signal splitter. Thus, in an exemplary apparatus, substantially all of the power found within the first channel of the received signal is passed to a signal input of a first tuner and substantially all of the power found within the second channel of the received signal is passed to a second signal input of a second tuner.

As noted above, a conventional signal splitter device distributes substantially all frequencies of the received signal to each output, but at reduced power. Consequently, each tuner gets only a portion of the channel power for the channel that it is tuned to while receiving, and wasting, signal power at frequencies that would be useful if directed to another tuner. The arrangement of the present invention distributes most of the signal energy in a particular channel to the tuner that will tune signals from within that channel. Thus the need for amplification of the input or output signals may be reduced or eliminated, along with the costs and performance degradation associated with amplification.

Additional advantages and features of the present invention will be apparent from the following detailed description and drawings which illustrate preferred embodiments of the invention.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention. It is to be understood that other embodiments may be utilized, and that structural, logical and electrical changes may be made without departing from the spirit and scope of the present invention.

Figure 1:
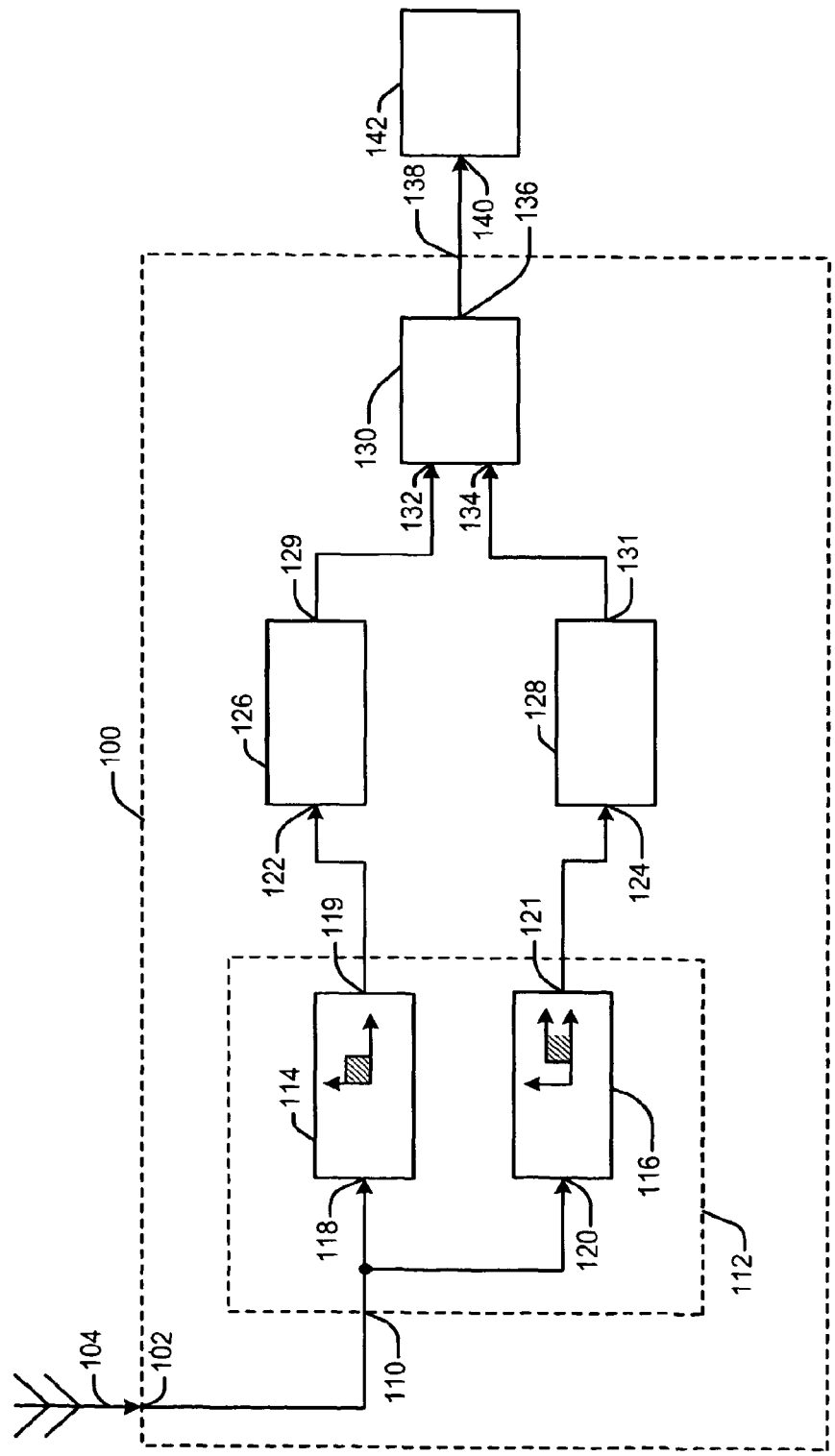
FIG. 1 shows, in block diagram form, a signal receiving system according to one embodiment of the invention.

FIG. 1 illustrates, in block diagram form, a signal tuning system 100 according to one embodiment of the invention. The tuning system 100 includes a local RF signal input 102. In the illustrated embodiment, the local RF signal input is electronically coupled to a terrestrial antenna device 104. Depending on the requirements of a particular system a preamplifier device may be optionally included.

The RF signal input 102 is coupled to an input 110 of a frequency diplexer device 112. The diplexer device 112 includes a first filter portion 114 and a second filter portion 116. The input 110 is mutually coupled to respective first 118 and second 120 inputs of the filter portions 114, 116.

In the illustrated embodiment the first filter portion 118 exhibits a low pass filter characteristic and the second filter portion 120 exhibits a high pass filter characteristic. One of skill in the art will appreciate, however, that a wide variety of filter arrangements may be advantageously employed in various embodiments of the invention. For example, the filter portions may include filter portions having a notch filter characteristic, filter portions having a bandpass filter characteristic and filter portions having a comb filter characteristic.

The first 114 and second 116 filter portions are coupled at respective outputs thereof 119, 121 to respective first 122 and second 124 inputs of a first tuner device 126 and a second tuner device 128. In various embodiments, these two devices 126, 128 may include respective preamplifier devices. The first and second tuner devices have respective tuner outputs 129, 131.

The tuner outputs 129, 131 of the first 126 and second 128 tuner devices are coupled to respective first and second inputs 132, 134 of a signal processing device 130. In various embodiments of the invention, the signal processing device includes, for example, a demodulator device, an MPEG decoder device, an output amplifier, and/or other signal processing devices and systems such as are known in the art.

In the illustrated example, a signal output 136 of the signal processing device 130 is coupled to, or serves as, an output 138 of the tuning system 100. As illustrated, this output may be coupled to an input 140 of a further device such as a video display device 142. As will be discussed in further detail below, the filters 114, 116 may have substantially fixed filter characteristics. In an alternative embodiment the filters 114, 116 may have adjustable filter characteristics.

The operation of exemplary apparatus according to the invention will now be discussed, in relation to the above-described embodiment, with reference to FIG. 1 and with further reference to FIGS. 2-6. One of skill in the art will appreciate that FIG. 2 has been idealized for clarity of presentation.

Figure 2:
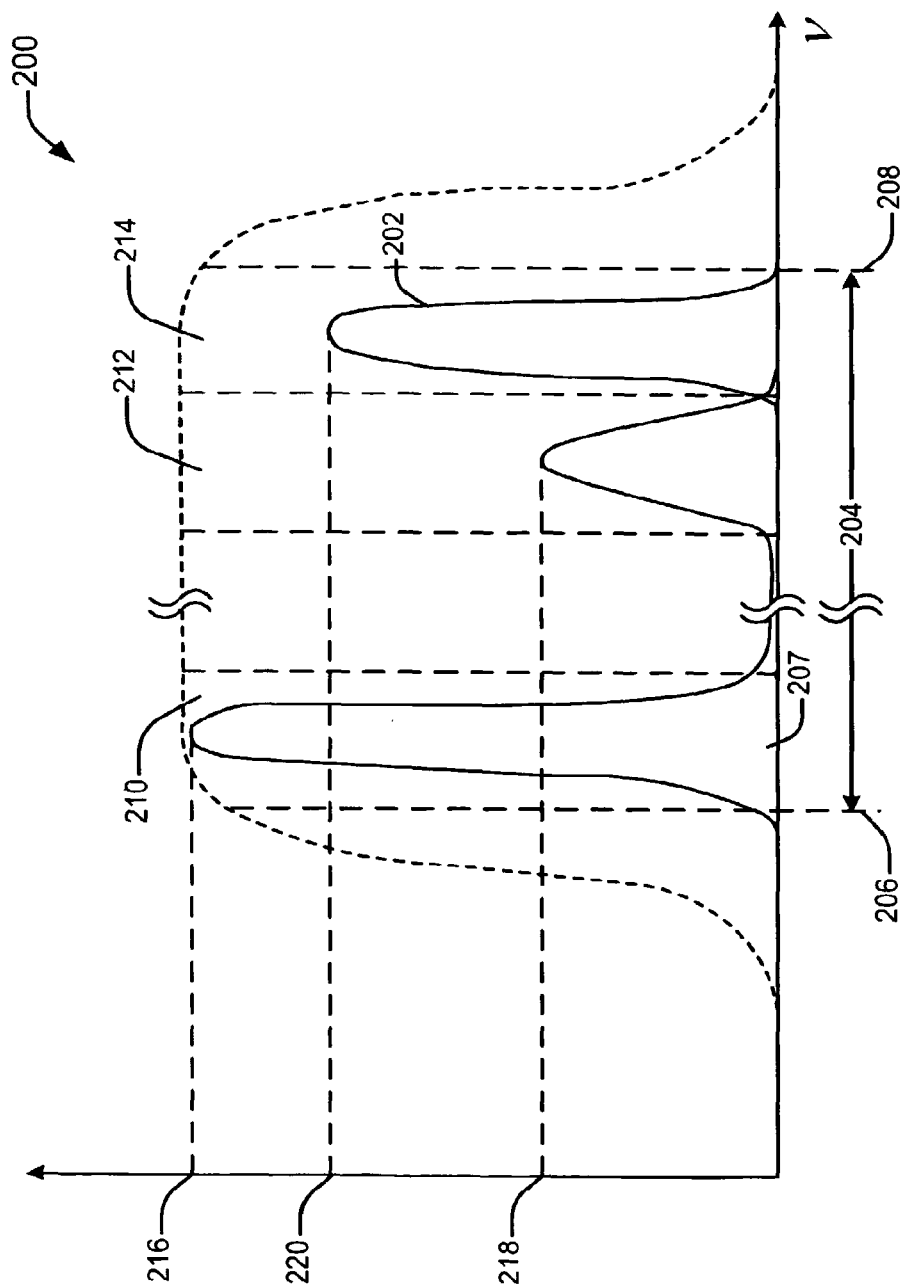
FIG. 2 shows, as a frequency domain graph, a modulated carrier signal including a television channel.

FIG. 2 shows a graphical representation 200, in the frequency domain, of a received signal 202. The received signal 202 is a signal such as might be received at a terrestrial receiving antenna, for example. Thus the signal 202 may be a composite signal made up of multiple signals received from respective discrete signal sources.

A tuning system is operative to receive frequencies within a bandwidth 204 defined by a lower corner frequency 206 and an upper corner frequency 208. A plurality of modulated channels is available within the exemplary bandwidth 204. As illustrated, these include a first channel 210, a second channel 212 and a third channel 214. One of skill in the art will appreciate that, depending on the bandwidth of the tuning system and the bandwidth of the individual channels 210, 212, 214, etc., many more channels may be available at various carrier frequencies within the bandwidth 204.

According to one embodiment of the invention, as shown, the amplitude of the received signal 202 varies over the bandwidth 204 of the receiver, so that each channel of the received signal has a respective time average amplitude e.g., 216, 218, 220. These amplitudes depend on such factors as, for example, antenna reception characteristics, broadcast power, distance between a broadcast and receiving antenna, and characteristics of the intervening transmission medium. One of skill in the art will appreciate, however, that other system configurations would result in substantially constant signal amplitude across the receiver bandwidth.

A tuner device is tunable to detect the frequencies of a signal within a particular channel, e.g. 210. Typically, a tuner device has a response characteristic 205 that is adapted to be substantially coincident with the channel 210 frequencies. The frequencies detected by the tuner are demodulated to extract channel information modulated onto the carrier signal 202. Successful demodulation of channel information depends upon the presence of adequate power in the incoming signal. The signal power available to the tuner is represented by the area 207 (within the channel 210) that lies below the signal envelope curve of the signal 202.

Figure 3A:
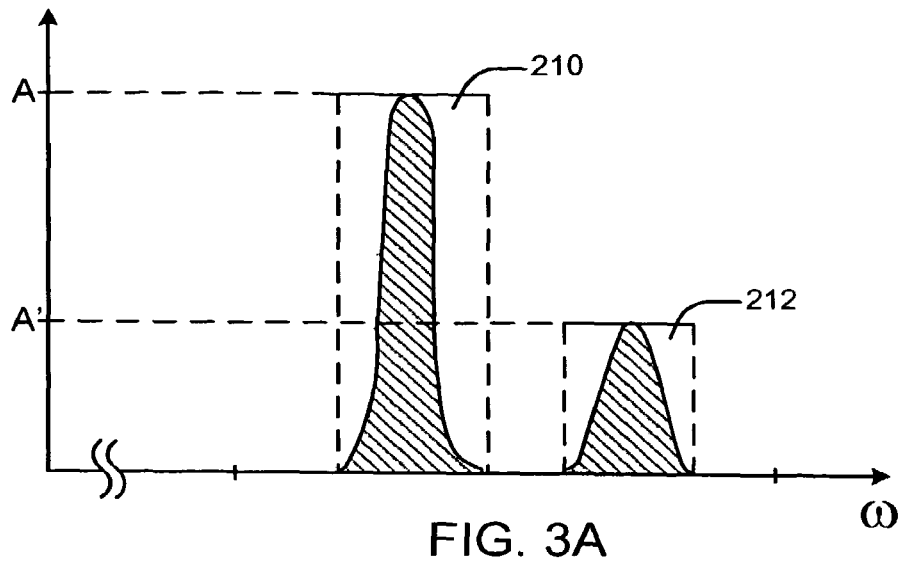
FIGS. 3A-3C show, as frequency domain graphs, a received signal and splitter output signals.
Figure 3B:
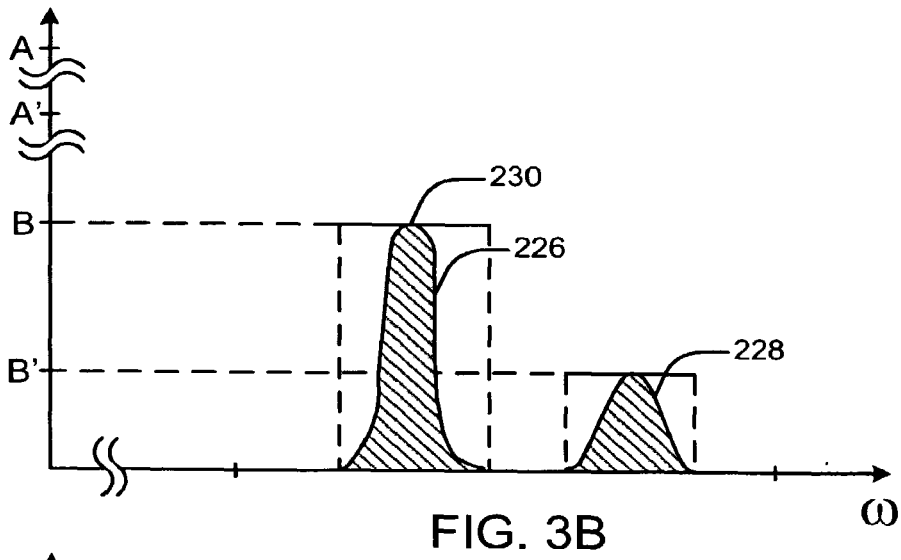
Figure 3C:
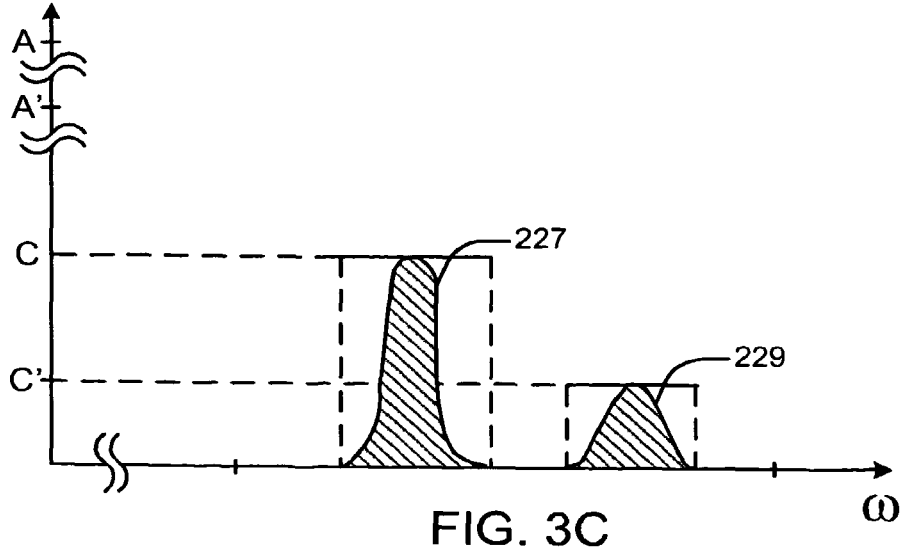

FIG. 3A illustrates, in graphical form, two exemplary channels 210, 212 of the received signal 202. The signals carried by the exemplary channels 210, 212 have respective amplitudes A and A'. In a conventional multi-tuner system a received signal 224 is split by a splitter having an input for receiving the received signal 202 and two outputs. FIG. 3B shows exemplary output signals 226, 228 as found at the first output of the splitter. FIG. 3C shows exemplary output signals 227, 229 as found at the second output of the splitter. As shown in FIGS. 3B and 3C each output of a conventional splitter receives a signal that includes substantially all of the frequencies found in the received signal 202 but at reduced amplitude B, B', C, C'.

It is possible to amplify the output signals of the splitter using one or more amplifier devices, and thereby recover the lost signal amplitude. Such amplifier devices may introduce distortion and signal noise, as well as add cost to the resulting system. Consequently the amplification of output signals may be undesirable.

In a symmetrical splitter, the corresponding amplitudes (B, C), (B', C'), of the output signals respectively are substantially equal (e.g. approximately A/2, A'/2 respectively). In an asymmetrical splitter these amplitudes are unequal. In any event, the un-amplified amplitudes of the output signals are less than the corresponding amplitudes of the received signal 202.

When the output signals of the splitter are applied to the inputs of respective tuners, the channel power available to each tuner, is less than that available in the received signal, as indicated, for example, by the reduced areas 230 under the exemplary signal envelope curve 226 as compared to area 207.

Figure 4A:
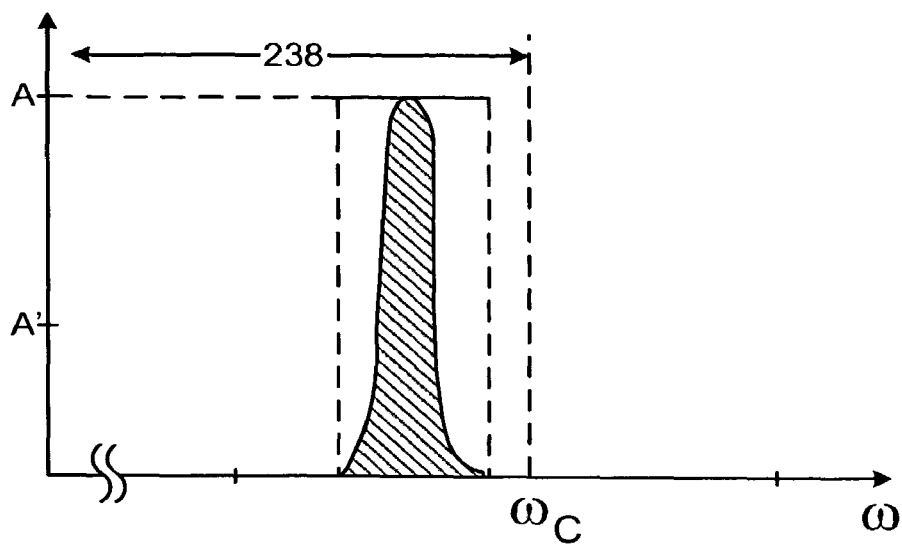
FIGS. 4A-4B show, as frequency domain graphs, output signals of a diplexer according to one embodiment of the invention.
Figure 4B:
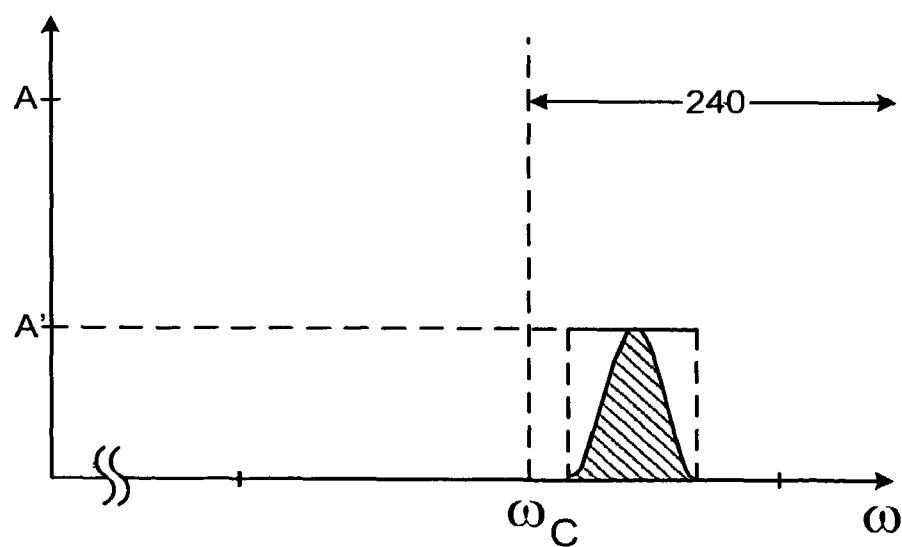

Referring now to FIGS. 4A and 4B, one sees a graphical representation of the respective signals available at the outputs 119, 121 of the diplexer device 112 (as shown in FIG. 1) of the invention. The diplexer device 112 of the present invention receives a carrier signal in two channels 210, 212 (as shown in FIG. 3A).

As illustrated in FIG. 4A, the diplexer provides a first range of frequencies 238 (below frequency $\omega_c$) to a first output 119 (as shown in FIG. 1). As illustrated in FIG. 4B the diplexer provides a second range of frequencies 240 (above frequency $\omega_c$) to a second output 121. The amplitudes A, A' of the respective signals at the diplexer outputs 119, 121 are substantially the same as those A, A' of the received signal (as shown in FIG. 3a). Thus the power levels available to the respective tuners, as indicated, e.g., by area 246 are larger than those available to the tuners in a conventional splitter system (as indicated by area 230). This additional power translates into superior output signal quality.

Figure 5:
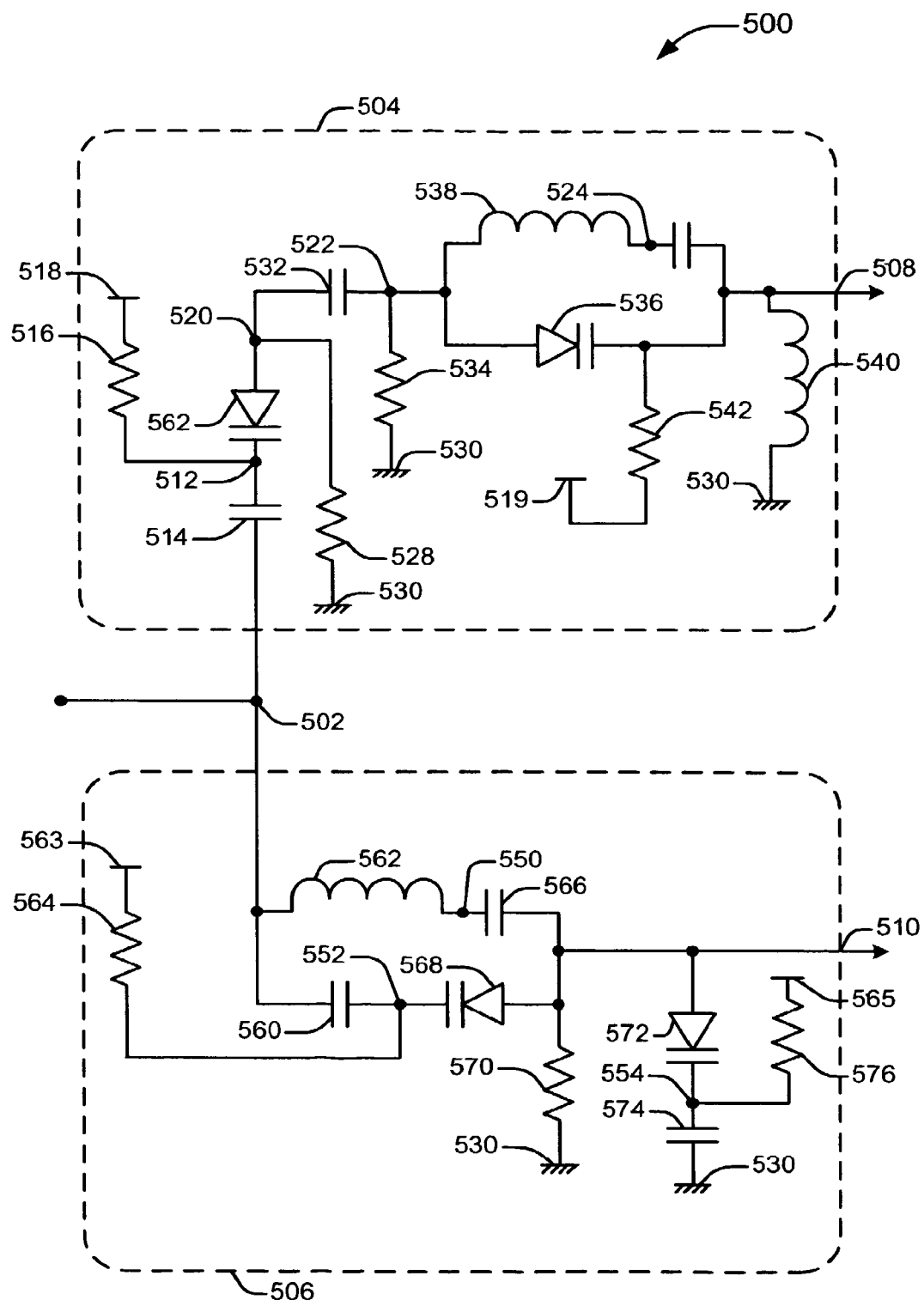
FIG. 5 shows a schematic circuit representation of a signal diplexer device according to one embodiment of the invention.

FIG. 5 shows, in circuit schematic form, a diplexer device 500 according to one embodiment of the invention. The diplexer device 500 includes an input node 502. The input node is electrically coupled to a first filter portion 504 and a second filter portion 506. The first 504 and second 506 filter portions have respective output nodes 508, 510. In the illustrated embodiment, the first filter portion 504 exhibits a high pass filter characteristic and the second filter portion 506 exhibits a low pass filter characteristic. As discussed above, however, a wide variety of filter characteristics are intended to fall within the scope of the invention. As will be discussed in additional detail below, in one embodiment the first and second filter portions are tunable filter portions.

Filter portion 504 includes a first tuning node 512. A capacitor, 514 is coupled between nodes 502 and 512. A resistor 516 is coupled between nodes 512 and a source of tuning voltage 518. In one embodiment of the invention, the source of tuning voltage may include a phase locked loop (PLL). In another embodiment, the source of tuning voltage may include a digital to analog converter (DAC).

Filter portion 504 includes additional nodes 520, 522 and 524. A varactor device 526 is coupled between nodes 512 and 520.

A resistor 528 is coupled between node 520 and a source of ground potential 530. A further capacitor 532 is coupled between nodes 520 and 522. A further resistor 534 is coupled between nodes 522 and the source of ground (or common node) potential 530. A further varactor device 536 is coupled between nodes 522 and 508. An inductive device 538, such as a coil, is coupled between nodes 522 and 524 and a further inductive device 540 is coupled between node 508 and the source of ground potential 530. In addition, a further resistor 542 is coupled between node 508 and a source of tuning voltage 519.

Filter portion 506 includes nodes 550, 552 and 554. Capacitor 560 is coupled between nodes 502 and 552. Inductive device 562 is coupled between node 502 and node 550. Resistor 564 is coupled between node 552 and a third source of tuning voltage 563. Further capacitor 566 is coupled between node 550 and node 510.

Varactor device 568 is coupled between node 552 and node 510. Resistor 570 is coupled between node 510 and the source of ground potential 530. A further varactor device 572 is coupled between node 510 and node 554. A further capacitor 574 is coupled between node 554 and the source of ground potential 530, and a further resistor 576 is coupled between node 554 and a fourth source of tuning voltage 565.

The components of the high pass filter portion 504 are adapted to produce a filter characteristic with a particular lower cutoff frequency. In one embodiment of the invention, the components of the low pass filter portion 506 are adapted to produce a filter characteristic with an upper cut off frequency that is substantially equivalent to the lower cutoff frequency of filter portion 504. In other embodiments of the invention, the lower cutoff and upper cut off frequencies are separated from one another. In one embodiment of the invention, the resulting pass bands of the filter portions overlap.

As noted above, in one embodiment, the first and second filter portions are tunable filter portions. Accordingly, the corner frequency of each filter is adjustable. In the illustrated embodiment, this adjustment is effected by control of the tuning voltages applied at tuning nodes 518, 519, 563 and 565. As would be understood by one of ordinary skill in the art, the capacitance of varactors 526 and 536 is adjustable by variation of the tuning voltages applied at node 518 and 519 respectively. In like fashion, the capacitance of varactors 568 and 572 is adjustable by variation of the tuning voltages applied at tuning nodes 563 and 565 respectively.

It should be noted that the sources of tuning voltage 518, 519, 563, 565 identified above are, in one embodiment of the invention, a single source of tuning voltage. In such an embodiment, nodes 518, 519, 563 and 565 are connected to one another. In other words, the sources of tuning voltage 518, 519 563 and 565 may be common to one another, may be grouped, or may be completely independent of one another. These sources of tuning voltage may be supplied by a single device, or by a plurality of devices. Also, as noted above, the source of tuning voltage may include a phase locked loop (PLL). In another embodiment, the source of tuning voltage may include a digital to analog converter (DAC). In a further embodiment, the source of tuning voltage may include a variable resistor.

In operation, the diplexer 500 is adapted to receive a modulated carrier signal at input node 502. A first band of frequencies up to the upper cutoff frequency is passed through low pass filter portion 506 to output node 510. According to one embodiment of the invention, this first band of frequencies includes at least a first signal channel. A second band of frequencies, higher than the above-mentioned lower cutoff frequency is passed through the high pass filter portion 504 to output node 508. This second band of frequencies includes at least a second signal channel. One of skill in the art will appreciate that, in light of the disclosure made herewith, the selection of particular component values for the disclosed devices is a matter of design.

One of skill in the art will appreciate that diplexer device 500 is only one of a wide array of possible diplexer arrangements. For example, the diplexer device may include one or more of an active filter device, a passive filter device, and a digital filter device. In various embodiments, the filter devices include filters composed of operational amplifiers and supporting components. In still other embodiments, a diplexer according to the invention includes one or more digital filters. In various embodiments, the digital filters are implemented with discrete components and in other embodiments the digital filters are implemented using microprocessor and/or digital signal processor (DSP) devices. In other embodiments, filters implemented as integrated circuits are employed.

One of ordinary skill in the art will appreciate that the diplexer is, in various embodiments, implemented as combinations of two or more of the foregoing filter devices. Accordingly, the invention includes, but is not limited to, all of the foregoing diplexer implementations. Furthermore, it is to be understood that the diplexer device discussed above is only an exemplary one of a wide variety of possible embodiments. Accordingly, various demultiplexer devices, as would be understood by one of skill in the art, are to be employed in various embodiments of the invention.

Figure 6:
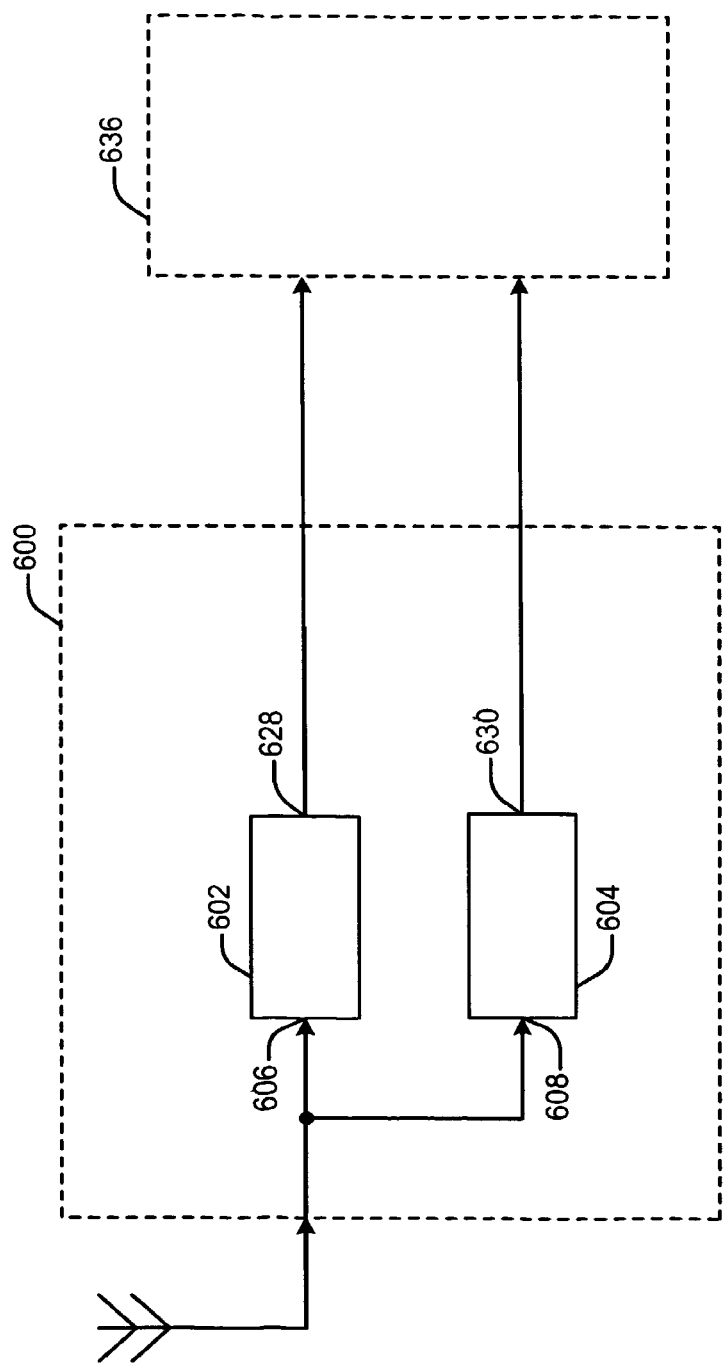
FIG. 6 shows, in block diagram form, an integrated circuit according to one embodiment of the invention.

FIG. 6 shows, in block diagram form, a further embodiment of the invention. As shown in FIG. 6, a diplexer device is implemented as an integrated circuit 600. The integrated circuit 600 includes a first filter portion 602 and a second filter portion 604. The filter portion 602, 604 have mutually connected input nodes 606, 608. As shown, filter portions 602, 604 are included on a common integrated circuit substrate. Output nodes 628, 630 may be coupled to respective input nodes of a further processing system 636. The further processing system may be one of a wide variety of systems such as, for example, a PIP display device, in accordance with various embodiments of the invention.

Optionally included on the integrated circuit substrate are first and second output amplifier devices. An input amplifier may also optionally be integrated on the substrate.

One of skill in the art will appreciate that the integrated circuit 600 of FIG. 6 includes a particular set of components according to one embodiment of the invention. In various embodiments, such an integrated circuit may readily include more or fewer components according to the demands of a particular application. For example, in one embodiment, the integrated circuit 600 is implemented to include only a single filter portion. In another embodiment a plurality of filter are portions are implemented on the integrated circuit substrate, but without input and output amplifier devices. In still another embodiment of the invention the integrated circuit device includes a complete tuner system including pre-amplifiers, diplexer, tuner devices, MPEG decoder devices and buffer devices. Another embodiment of the invention includes an RF modulation device adapted to modulate a complete PIP display signal onto an RF carrier signal.

Figure 7:
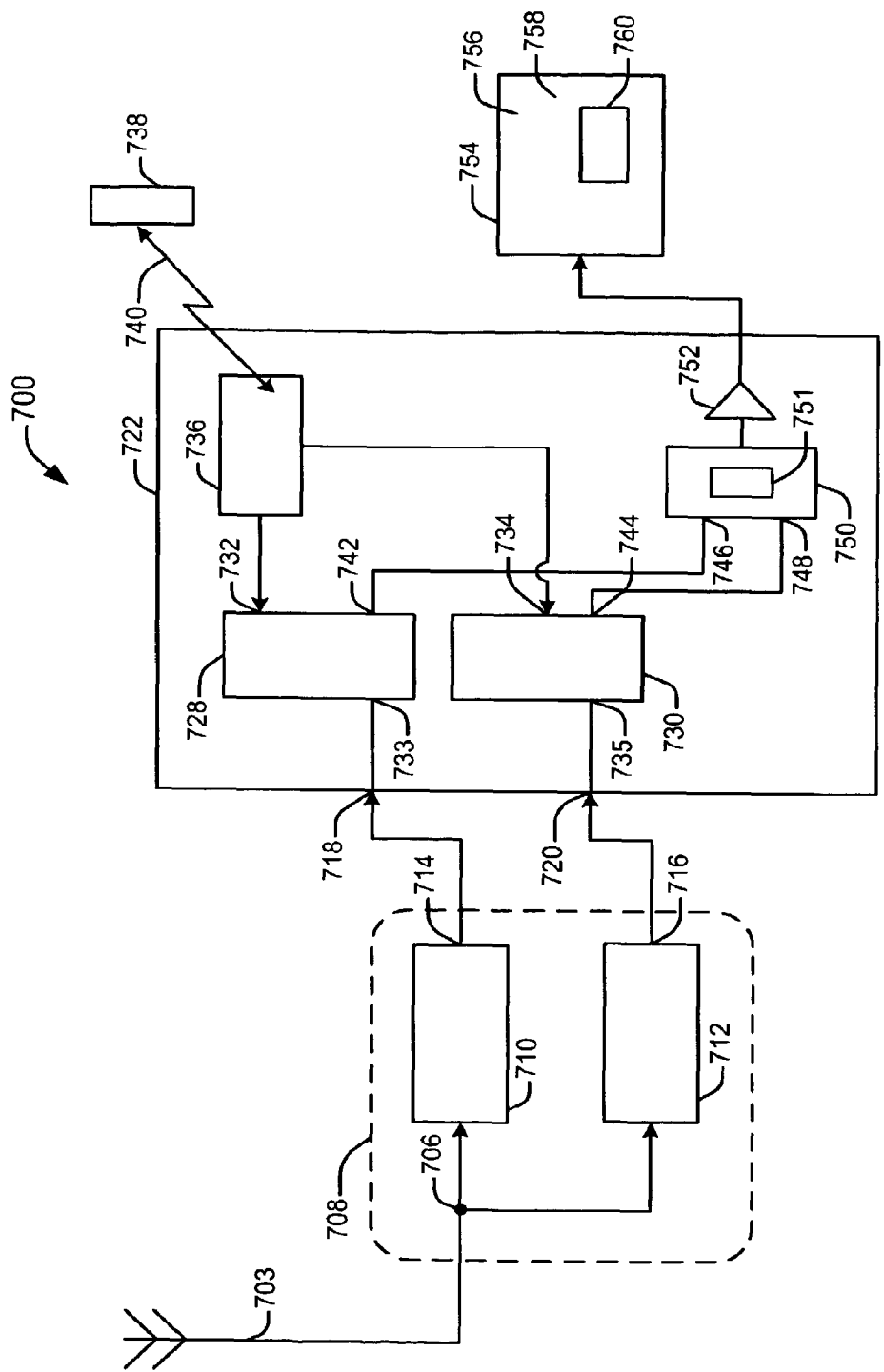
FIG. 7 shows, in block diagram form, a PIP system, including a signal diplexer device, according to one embodiment of the invention.

FIG. 7 shows, in block diagram form, a PIP display system 700 according to a further embodiment of the invention. The PIP display system 700 includes an input node 706 of a diplexer device 708. The input node 706 is adapted to receive, for example, a modulated radiofrequency signal. The modulated RF signal may be received from, for example, a coaxial cable 703.

In the illustrated embodiment, the diplexer device includes a first filter portion 710 and a second filter portion 712. The first and second filter portions have respective output nodes 714, 716 that are coupled to respective input nodes 718, 720 of a tuner subsystem 722. The input nodes 718, 720 are coupled to respective inputs 733, 735 of first 728 and second 730 tuner devices.

In the illustrated embodiment, the tuner devices 728, 730 also have respective control inputs 732, 734. These control inputs 732, 734 are coupled to receive control signals from a control device 736 such as, for example, a microprocessor or microcontroller device.

In one embodiment of the invention, the controller device 736 is adapted to receive a control signal from a user by way of a remote control device 738. In one embodiment, this communication between the remote control device 738 and the control device 736 is implemented over a wireless communication link 740, such as, for example, a radiofrequency communication link, an optical frequency communication link, an ultrasonic communication link and/or a combination of the foregoing.

The tuner devices 728, 730 also include respective output nodes 742, 744 that are coupled to respective input nodes 746, 748 of a PIP image integration device 750. In one embodiment, the image integration device 750 includes an MPEG decoder device 751. In one embodiment, the image integration device 750 is adapted to receive respective first and second video signals at the input nodes 746, 748 and combine the same into an integrated video signal. The integrated video signal is output from the image integration device 750 through an output buffer amplifier device 752 to an input of a display device 754. The display device 754 includes a display screen 756 on which the integrated video signal is represented as a PIP display including a first main image region 758 and a second PIP image region 760.

Figure 8:
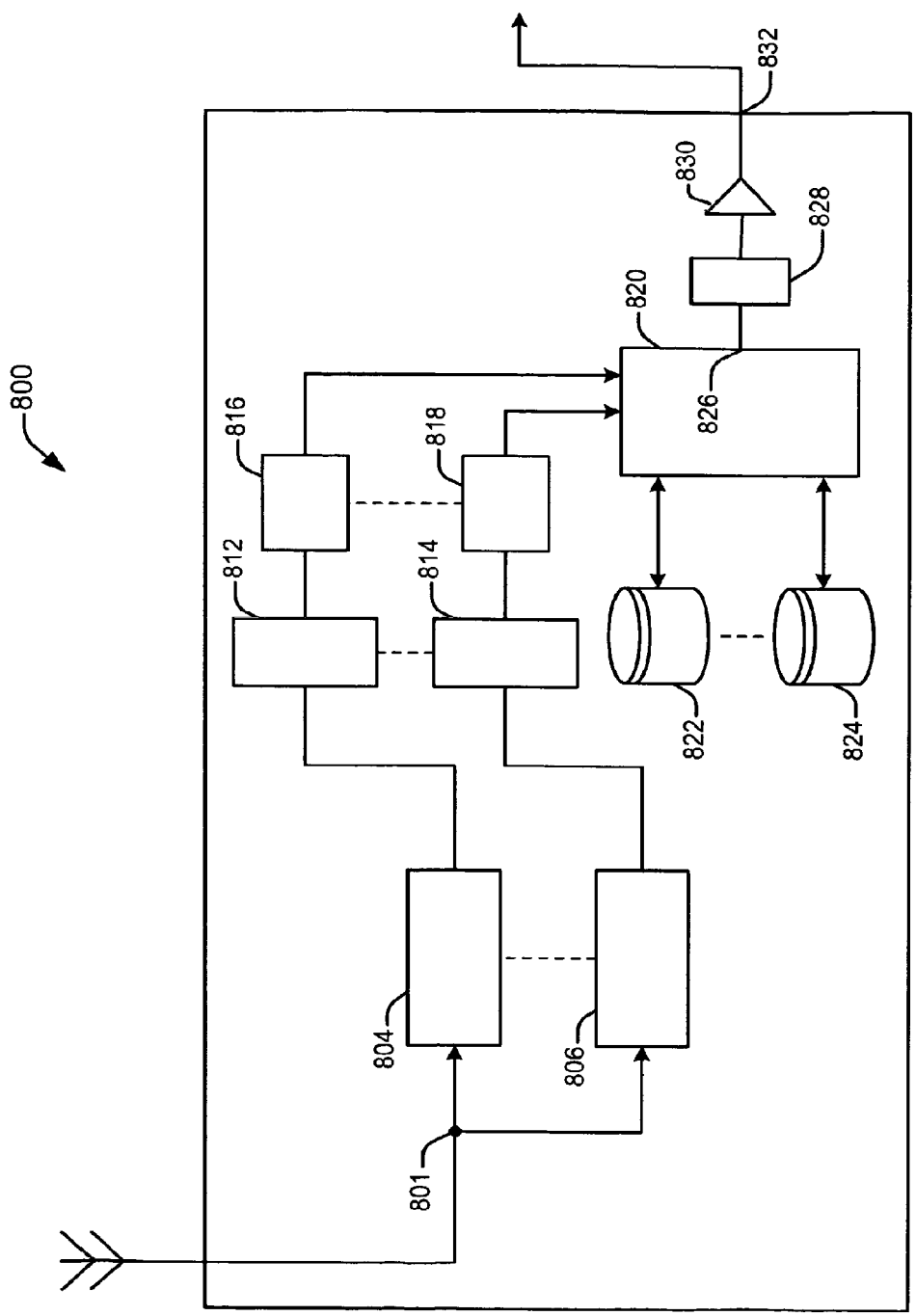
FIG. 8 shows a personal video recorder (PVR) system, including a signal diplexer device, according to one embodiment of the invention.

FIG. 8 shows a personal video recorder (PVR) system 800 according to one embodiment of the invention. An input node 801 of the PVR system 800 is mutually coupled to respective inputs of two or more filter devices e.g., 804, 806. The filter devices 804, 806 are in turn coupled at respective outputs thereof to respective tuner devices 812, 814. Optionally, respective buffer amplifiers may be coupled between the filter devices and the tuner devices. The tuner devices 812, 814 are in turn coupled to respective decoder devices 816, 818 such as, for example, MPEG decoder devices, MPEG II decoder devices, or other decoder devices.

Respective outputs of the decoder devices 816, 818 are coupled to respective inputs of a control subsystem 820. In various embodiments, the control subsystem includes, for example, address, data and control buses, buffering components, control component such as, for example, microprocessor and/or microcontroller and other control devices such as are known in the art. As illustrated, the control subsystem 820 is coupled to one or more data storage devices 822, 824 such as, for example, hard disk drive data storage devices, flash memory data storage devices, static RAM data storage devices, EEPROM data storage devices, optical disk data storage devices, and other data storage devices, including combinations of the foregoing, such as are known in the art. At an output port 826 thereof, the control subsystem is coupled to an input of a further processing device 828.

One of skill in the art will appreciate that this further processing device 828 may include an additional decoder device, such as an MPEG decoder device. In a further embodiment, decoder devices 816 and 818 are omitted, and encoded data is stored directly to storage devices 822 and 824. As shown, an output of the further processing 828 device is coupled, through a further buffer amplifier 830 to an output 832 of the PVR 800. This output 832 is adapted to be coupled to, e.g., a conventional television device, as is known in the art.

As can be seen by the embodiments described herein, the present invention encompasses a method and apparatus for distributing a received signal to a plurality of signal processing devices such as tuners.

It should again be noted that although the invention has been described with specific reference to video receiving equipment including PIP video receiving equipment, the invention has broader applicability and may be used in a wide variety of video receiving equipment and methods. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

The invention claimed is:

1. A video processing system comprising:
   an RF signal input operative to receive a band of RF signals;
   a diplexer device having an input and first and second outputs, said input of said diplexer coupled to said RF signal input operative to provide first and second RF output signals of mutually exclusive channel frequencies from said band of RF signals at respective ones of said first and second outputs exclusively;
   a first tuner having a first tuner input coupled to said first output of said diplexer;
   a second tuner having a second tuner input coupled to said second signal output of said diplexer; and
   a video signal processor for generating a signal representing multiple images, said video signal processor having first and second inputs coupled to respective ones of first and second outputs of said first and second tuners, wherein
   said band of RF signals at said input of said diplexer include said first modulated channel signal at a first channel frequency and second modulated channel signal at a second channel frequency, said first modulated channel signal has a first signal power, said second modulated channel signal has a second signal power,
   said first output of said diplexer provides said first modulated channel signal at said first channel frequency with said first signal power for said first tuner being tuned to said first channel frequency,
   said second output of said diplexer provides said second modulated channel signal at said second channel frequency with said second signal power for said second tuner being tuned to said second channel frequency,
   said diplexer device further comprises first and second tunable filters, said first tunable filter is tuned to pass said first channel signal to said first output of said diplexer while blocking said second channel signal when said first tuner is tuned to said first modulated channel signal, said second tunable filter potion is tuned to pass said second channel signal to said second output of said diplexer while blocking said first channel signal when said second tuner is tuned to said second modulated channel signal.

2. The video processing system as defined in claim 1 wherein said first filter portion includes a low pass filter and said second filter portion includes a high pass filter.

3. The video processing system as defined in claim 1 wherein said first and second tuners include respective first and second control inputs, said first and second control inputs being mutually coupled to a controller device.

4. The video processing system as defined in claim 1 wherein said video signal processor includes an MPEG decoder device.

5. The video processing system as defined in claim 1 wherein said diplexer device comprises an integrated circuit device.

6. The video processing device as defined in claim 5 wherein said integrated circuit device comprises an integrated amplifier device.

7. The video processing system as defined in claim 1 further comprising at least one data storage device.

8. The video processing system as defined in claim 7 wherein said at least one data storage device comprises a hard disk storage device.

9. The video processing system as defined in claim 7 wherein said at least one data storage device comprises a flash memory storage device.

10. A method of generating a video signal comprising the steps of:
    receiving a band of RF signals;
    diplexing said band of RF signals to provide first and second RF output signals of mutually exclusive channel frequencies from said band of RF signals at respective ones of first and second output points exclusively; and
    tuning to and demodulating each one of said first and second modulated channel signals to generate a signal representing multiple images, wherein
    said RF band of signals include first modulated channel signal at a first channel frequency and a second modulated channel signal at a second channel frequency, said first modulated channel signal has a first power, said second modulated channel signal has a second signal power,
    said first output signal provides said first modulated channel signal at said first channel frequency with said first signal power for said tuning step being tuned to said first channel frequency, said second output signal provides said second modulated channel signal at said second channel frequency with said second signal power for said tuning step being tuned to said second channel frequency;

said diplexing step further comprising the steps of:

passing said first modulated channel signal to said first output while blocking said second modulated channel signal when said tuning step is tuned to said first modulated channel, and passing said second modulated channel signal to said second output while blocking said first modulated channel signal when said tuning step is tuned to said second modulated channel.

11. The method of generating a video signal as defined in claim 10 further comprising the step of decoding said demodulated first and second channel signals in an MPEG decoder device.

12. The method of generating a video signal as defined in claim 10 further comprising the step of displaying said images on a display screen.

13. The method of generating a video signal as defined in claimed 12 wherein said display screen includes a first main image region and a second PIP image region.

\* \* \* \* \*